United States Patent [19]
Nakamura et al.

[11] Patent Number: 5,519,714
[45] Date of Patent: May 21, 1996

[54] TESTABLE SCAN PATH CIRCUIT OPERABLE WITH MULTI-PHASE CLOCK

[75] Inventors: Yoshiyuki Nakamura; Masaaki Yoshida, both of Tokyo, Japan

[73] Assignee: NEC Corporation, Tokyo, Japan

[21] Appl. No.: 154,206

[22] Filed: Nov. 18, 1993

[30] Foreign Application Priority Data

Nov. 18, 1992 [JP] Japan ................... 4-308380

[51] Int. Cl.$^6$ .............. G01R 31/28; G06F 11/00
[52] U.S. Cl. ............... 371/22.3; 371/25.1; 324/73.1; 307/404; 307/406
[58] Field of Search .......... 371/22.3, 25, 25.1, 371/22.1; 324/158 R, 73.1; 340/811; 307/404, 406

[56] References Cited

U.S. PATENT DOCUMENTS

| | | | |
|---|---|---|---|
| 4,649,539 | 3/1987 | Crain et al. | 371/22.3 |
| 4,860,290 | 8/1989 | Daniels et al. | 371/25 |
| 4,942,577 | 7/1990 | Ozaki | 371/22.3 |
| 5,021,774 | 6/1991 | Ohwada et al. | 340/811 |
| 5,043,986 | 8/1991 | Agrawal et al. | 371/25.1 |
| 5,130,646 | 7/1992 | Kojima | 324/158 R |
| 5,260,946 | 11/1993 | Nunally | 371/22.1 |

*Primary Examiner*—Edward R. Cosimano
*Assistant Examiner*—Kamini S. Shah
*Attorney, Agent, or Firm*—Whitham, Curtis, Whitham & McGinn

[57] ABSTRACT

A logic circuit associated with a scan path circuit includes at least one clock controller and at least one scan flipflop. The clock controller includes a first control gate receiving a clock signal and a scan mode signal and configured to maintain its output at a fixed value when the scan mode signal is active, a second control gate receiving an output of the first control gate and a first test clock signal for generating a first enable signal, and a third control gate receiving an output of the second control gate and a second test clock signal for generating a second enable signal. The scan flipflop includes a selector having a pair of inputs receiving a data input signal and a scan input signal, respectively, and also having a selection input receiving the scan mode signal so that when the scan mode signal is active, the scan input signal is selected, and when the scan mode signal is inactive, the data input signal is selected. A first latch circuit receives an output of the selector at its data input and the first enable signal at its enable terminal. A second latch circuit receives an output of the first latch circuit at its data input and the second enable signal at its enable terminal.

20 Claims, 10 Drawing Sheets

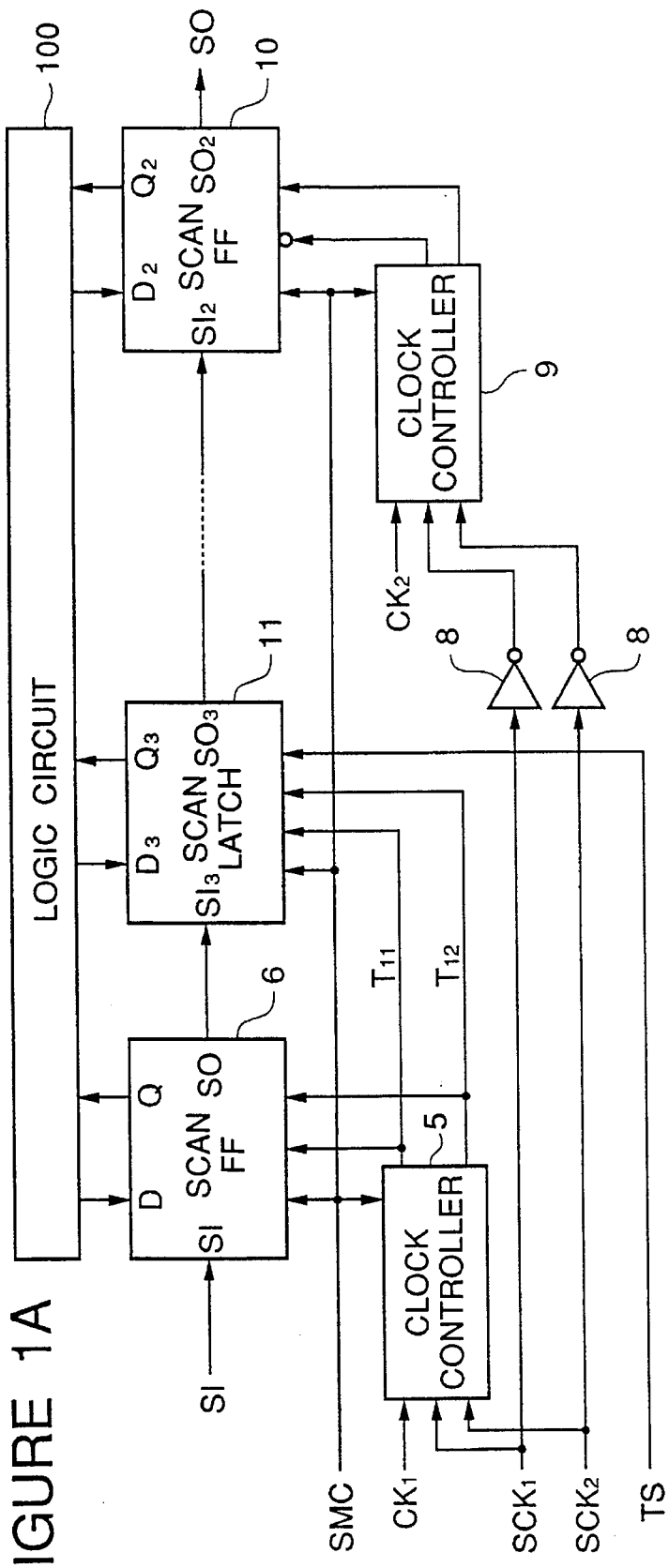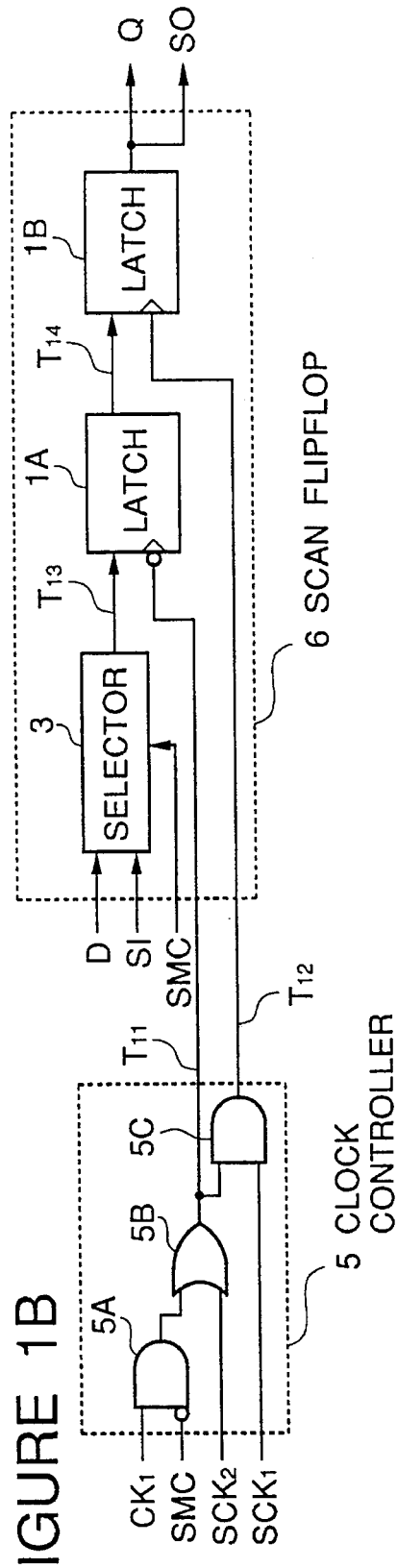
FIGURE 1A
FIGURE 1B

SMC

CK₁

SCK₁

SCK₂

T₁₁

T₁₂

D

SI

T₁₃

T₁₄

SO(Q)

TESTABLE SCAN PATH CIRCUIT OPERABLE WITH MULTI-PHASE CLOCK

BACKGROUND OF THE INVENTION

1. Field of the invention

The present invention relates to a logic circuit, and more specifically to a scan path circuit for testing a sequential circuit driven with a multi-phase clock.

2. Description of related art

In general, since it is more difficult to test a sequential circuit internally provided in a logic circuit, than to test a combinational circuit, various logic circuit designs have been attempted. Of these attempted logic circuit designs, a scan path circuit for making it possible to observe flipflops provided in the sequential circuit by supplying values to these flipflops from an external, is particularly widely used. However, a conventional scan path circuit is disadvantageous in that the circuit malfunctions because of a clock skew at the time of shifting, or the circuit cannot operate as a multi-phase clock driven sequential circuit at a non-testing time.

Japanese Patent Laid-open Publication No. Heisei 3-180198, the disclosure of which is incorporated by reference in its entirety into the present application, discloses a logic integrated circuit having a scan circuit designed to overcome the problem caused by the clock skew at the time of shifting, and to be able to operate with a multi-phase clock. This logic integrated circuit is so configured that first and second clocks and a first test clock signal are supplied to two selectors which are controlled by a test mode signal, so that at a non-testing time, each flipflop is driven by a corresponding one of the first and second clock signals, and at a testing time, each flipflop is driven by the first test clock signal and a second test clock signal.

However, this conventional logic circuit cannot test the first and second clock signals since these first and second clock signals are not used at the testing time. In addition, this conventional logic circuit has a restriction in design that each flipflop must be driven by a positive going clock. In many cases, the logic integrated circuits are generally designed to be driven with a multi-phase clock, and therefore, the test circuit for the sequential circuit is required to comply with such logic integrated circuits. In addition, this constituents included in the circuit must be able to be tested. However, the above mentioned conventional logic circuit cannot test the normal clock signals if the test clock signals am selected by the test mode signal.

SUMMARY OF THE INVENTION

Accordingly, it is an object of the present invention to provide a scan path circuit which has overcome the above mentioned defect of the conventional one, Another object of the present invention is to provide a scan path circuit capable of operating with a multi-phase clock and of testing all clock signals.

The above and other objects of the present invention are achieved in accordance with the present invention by a logic circuit associated with a scan path circuit, comprising:

at least one clock controller including
a first control gate receiving a clock signal and a scan mode signal and configured to maintain its output at a fixed value when the scan mode-signal is active,
a second control gate receiving an output of the first control gate and a first test clock signal for generating a first enable signal, and
a third control gate receiving an output of the second control gate and a second test dock signal for generating a second enable signal; and at least one scan flipflop including
a selector having a pair of inputs receiving a data input signal and a scan input signal, respectively, and also having a selection input receiving the scan mode signal so that when the scan mode signal is active, the scan input signal is selected, and when the scan mode signal is inactive, the data input signal is selected,
a first latch circuit having a data input receiving an output of the selector and an enable terminal receiving the first enable signal, and
a second latch circuit having a data input receiving an output of the first latch circuit and an enable terminal receiving the second enable signal.

According to another aspect of the present invention, there is provided a logic circuit associated with a scan path circuit, comprising:

at least one clock controller including
a first control gate receiving a clock signal and a scan mode signal and configured to maintain its output at a fixed value when the scan mode signal is active,
a second control gate receiving an output of the first control gate and a first test clock signal for generating a first enable signal, and
a third control gate receiving an output of the second control gate and a second test clock signal for generating a second enable signal; and at least one scan latch including
a first selector having a pair of inputs receiving a dam input signal and a scan input signal, respectively, and also having a selection input receiving the scan mode signal so that when the scan mode signal is active, the scan input signal is selected, and when the scan mode signal is inactive, the data input signal is selected,
a first latch circuit having a data input receiving an output of the selector and an enable terminal receiving the first enable signal,
a second selector having a pair of inputs receiving the data input signal and an output of the first latch circuit, respectively, and also having a selection input receiving a test mode signal so that when the test mode signal is active, the output of the first latch circuit is selected, and when the test mode signal is inactive, the data input signal is selected, and
a second latch circuit having a data input receiving an output of the second selector and an enable terminal receiving the second enable signal.

The above and other objects, features and advantages of the present invention will be apparent from the following description of preferred embodiments of the invention with reference to the accompanying drawings.

BRIEF DESCRIPTION OF THE DRAWINGS

FIG. 1A is a block diagram of a first embodiment of the scan path circuit in accordance with the present invention;

FIG. 1B is a derailed logic circuit diagram of the clock controller and the scan flipflop shown in FIG. 1A;

DESCRIPTION OF THE PREFERRED EMBODIMENTS

Figure 2:
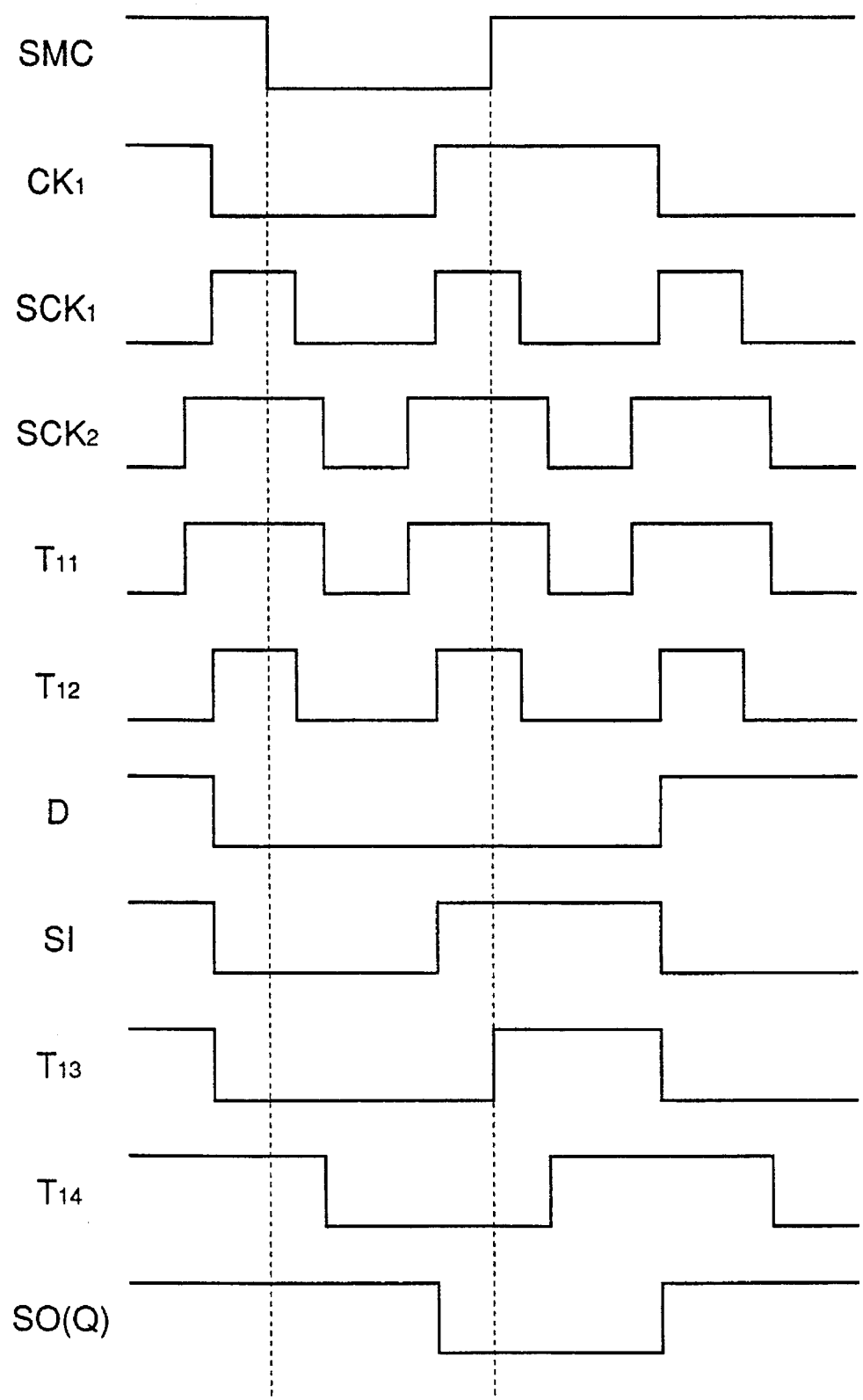
FIG. 2 is a timing chart illustrating an operation of the circuit shown in FIG. 1B in the case that the clock is normal.

Referring to FIG. 1A, there is shown a block diagram of a first embodiment of the scan path circuit in accordance with the present invention. FIG. 1B is a derailed logic circuit diagram of the clock controller and the scan flipflop shown on FIG. 1A.

As shown in FIG. 1A, a logic Circuit 100 are connected with a number of scan flipflops and a number of scan latches, which is cascade-connected to form a scan path circuit, and each of which is connected to receive a data signal D, $D_1$, $D_2$, ..., from the logic circuit 100 and to supply an output signal Q, $Q_1$, $Q_2$, ..., to the logic circuit 100. The cascade-connected circuit receives a seen input signal SI at its initial stage and outputs a scan output signal SO from its final stage. However, for simplification of the drawing, only two scan flipflops 6 and 10 and one scan latch 11 are shown in FIG. 1A. The scan flipflop 6 and the scan latch 11, and the scan flipflop 10 are controlled by the associated clock controllers 5 and 9, respectively.

As shown in FIG. 1B, the clock controller 5 includes a first AND gate 5A receiving a clock signal $CK_1$ and an inverted signal of a scan mode signal SMC, an OR gate 5B receiving an output of the first AND gate 5A and a second test clock signal $SCK_2$ and generating a latch enable signal $T_{11}$, and a second AND gate 5C receiving an output of the OR gate 5B and a first test clock signal $SCK_1$ and generating another latch enable signal $T_{12}$.

The scan flipflop 6 includes a selector 3 having two data inputs receiving for example a data input signal D and the scan input signal SI, respectively, and a control input connected to receive the scan mode signal SMC. An output signal T13 of the selector 3 is supplied to a data input of a first latch circuit 1A, which has an enable terminal receiving an inverted signal of the latch enable signal $T_{11}$, and which generates a latch output signal $T_{14}$. The latch output signal $T_{14}$ is supplied to a data input of a second latch circuit 1B, which has an enable terminal receiving the latch enable signal $T_{12}$, and which generates a data output signal Q. The selector 3 is controlled by the scan mode signal SMC in such a manner that the output signal $T_{13}$ of the selector 3 becomes the value of the data input signal D when the scan mode signal SMC is "0" and the value of the scan input signal SI when scan mode signal SMC is "1".

The output signals of the dock controller 5 are also supplied to the scan latch 11. Each of the first and Second test clock signals $SCK_1$ and $SCK_2$ is supplied through an inverter 8 to the clock controller 9, which controls the scan flipflop 10.

Now, operation of this embodiment of the logic circuit shown in FIG. 1B at the test time will be explained with reference to FIGS. 2 and 3.

First, when a shifting operation is performed, the scan mode signal SMC is rendered "1". At this time, since the output of the first AND gate 5A in the clock controller 5 is always "0", the signal $T_{11}$ becomes the value of the second test clock signal $SCK_2$, regardless of the value of the clock signal $CK_1$. Accordingly, since a clock used for the shift operation is independent of the clock signal $CK_1$, the clock signal $CK_1$ may be a multi-phase clock.

As regards the scan flipflop 6, when the scan mode signal SMC is "1", the selector 3 selects the scan input signal SI. In order to properly shift the scan input signal SI, respective enable signals for the latch circuit 1A and the latch circuit 1B must not be simultaneously in an enable condition. In this connection, differing from the conventional scan flipflop of the single phase type, the enable signal for the First latch circuit 1A is made independent of the enable signal for the second latch circuit 1B, and therefore, it is possible to easily prevent the enable signals for both of the latch circuit; 1A and 1B from being simultaneously brought into the enable condition. For example, it is sufficient if the first test clock signal SCK 1 and the second test clock signal $SCK_2$ are set as shown in FIGS. 2 and 3.

Accordingly, the logic integrated circuit of the shown embodiment can avoid the malfunction caused by the clock skew. A featured point of the shown embodiment differing from the conventional embodiment explained with reference to Japanese Patent Laid-open Publication No. Heisei 3-180198, is that the scan circuit can be used as a flipflop or a latch which has a different clock polarity at a non-testing time, and it is possible to use a plurality of different clock signals and to perform a failure detection as mentioned above by using these clock signals.

Now, explanation will be made to clarify that an error in the clock $CK_1$ can be detected by the above mentioned embodiment of the logic circuit. For this purpose, the scan mode signal SMC is rendered "0", so that the clock signal $CK_1$ is supplied to the OR gate 5B.

Now, it is assumed that the clock signal $CK_1$ changes its value as shown in FIG. 2. At this time, the signal $T_{11}$ becomes the value of the second test clock signal $SCK_2$ as shown in FIG. 2, and the signal $T_{12}$ becomes the value of the first test clock signal SCK 1 as shown in FIG. 2. In addition, the data input D shown in FIG. 2 is supplied to the scan flipflop 6.

Figure 3:
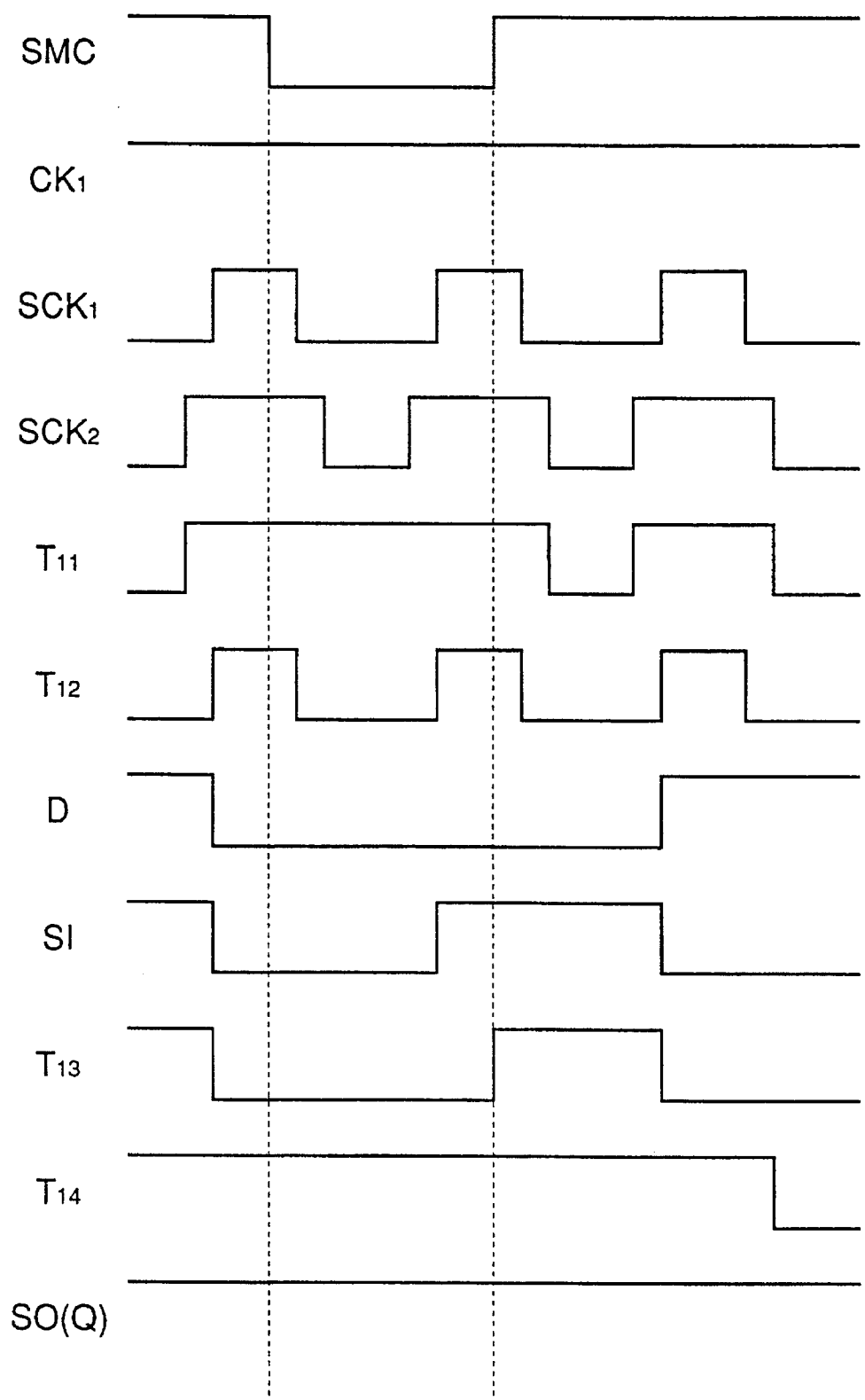
FIG. 3 is a timing chart illustrating an operation of the circuit shown in FIG. 1B in the case that the clock is not normal.

Here, assuming that the value of the clock signal $CK_1$ erroneously becomes as shown in FIG. 3, when the value of the scan mode signal SMC is at "0", the value of the signal $T_{11}$ is maintained at "1" as shown in FIG. 3. Accordingly, the scan flipflop 6 maintains the previously input scan data as shown in FIG. 3. This difference of the output signal of the scan flipflop can be observed externally by repeatedly performing the shift operation.

Figure 4:
FIG. 4 is a timing chart illustrating an operation of the circuit shown in FIG. 1B at a non-testing time.
Figure 4:
Figure 4:
Figure 4:
Figure 4:
Figure 4:
Figure 4:
Figure 4:

In the shown logic integrated circuit, if, at a non-testing time, the scan mode signal SMC, the first test clock signal $SCK_1$ and the second test clock signal $SCK_2$ are fixed to "0", "1" and "0", respectively, as shown in FIG. 4, the circuit operates as a flipflop having the data input signal D as its data input and the clock signal $CK_1$ as its clock input.

Figure 5:
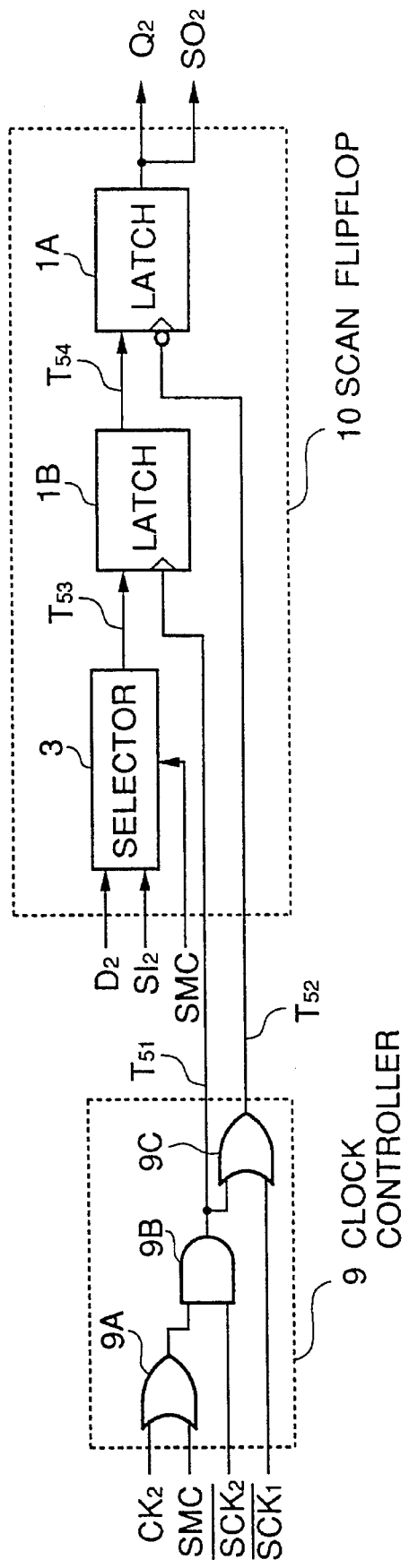
FIG. 5 is a detailed logic circuit diagram of the clock controller and the scan flipflop, showing a second embodiment of the scan path circuit in accordance with the present invention.

At the non-testing time, the circuit shown in FIG. 1B operates as the flipflop driven by a positive going clock (or a rising edge of a clock). However, a circuit which operates as the flipflop driven by a negative going clock (or a falling edge of a clock), can be realized by a clock controller for the negative going clock and a scan flipflop for the negative going clock, as shown in FIG. 5 which illustrates a second embodiment. FIG. 5 is a derailed logic circuit diagram of the clock controller 9 and the scan flipflop 10 shown on FIG. 1A.

The clock controller 9 is constituted by replacing the first AND gate 5A, the OR gate 5B and the second AND gate 5C of the clock controller 5 with a first OR gate 9A, an AND gate 9B and a second OR gate 9C, respectively. The scan flipflop 10 is constituted by mutually exchanging the first latch 1A and the second latch 1B in the scan flipflop 6.

When the scan mode signal SMC is "0", an output $T_{S1}$ of the clock controller 9 for the negative going clock becomes an inverted value of the clock signal $CK_2$ in accordance with the value of a dock signal $CK_2$.

Figure 6:
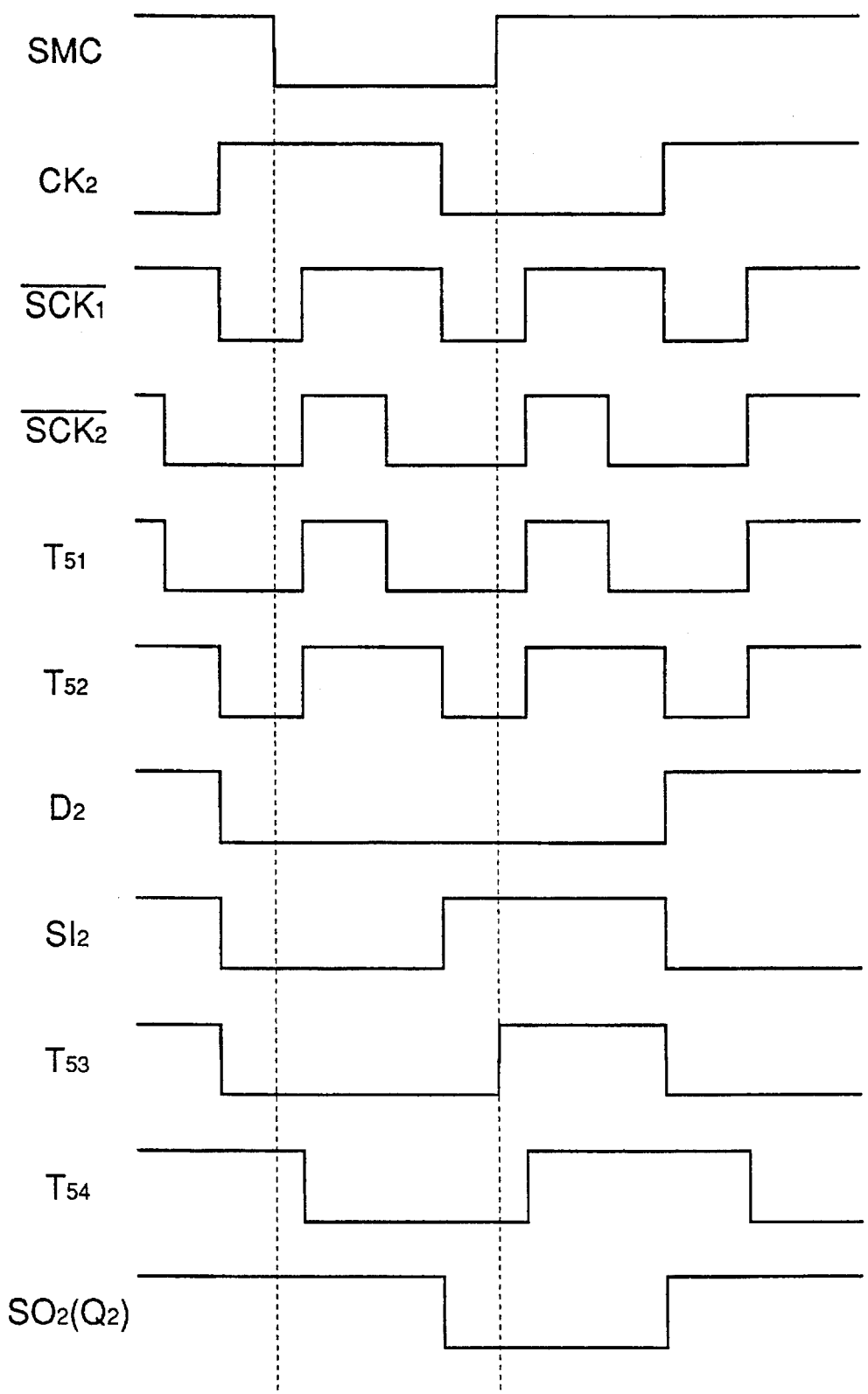
FIG. 6 is a timing chart illustrating an operation of the circuit shown in FIG. 5 in the case that the clock is normal.
Figure 7:
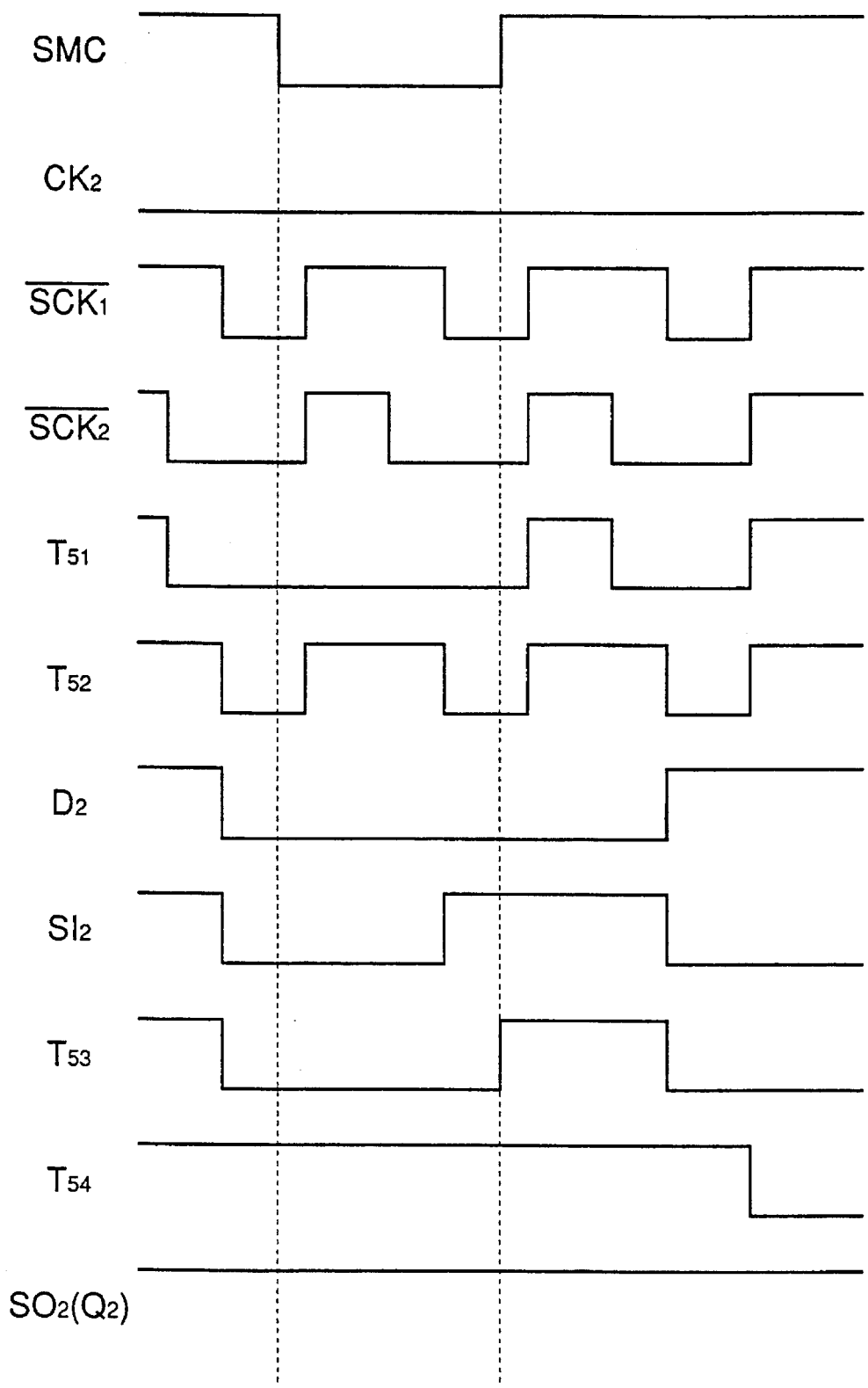
FIG. 7 is a timing chart illustrating an operation of the circuit shown in FIG. 5 in the case that the clock is not normal.

A normal operation of this circuit is illustrated in FIG. 6, and an operation of this circuit when the clock is in error is illustrated in FIG. 7. It would be understood from comparison between FIGS. 6 and 7 that a difference or abnormality of the clock signal $CK_2$ can be observed as a difference or abnormality of the scan output signal $SO_2$.

Figure 8:
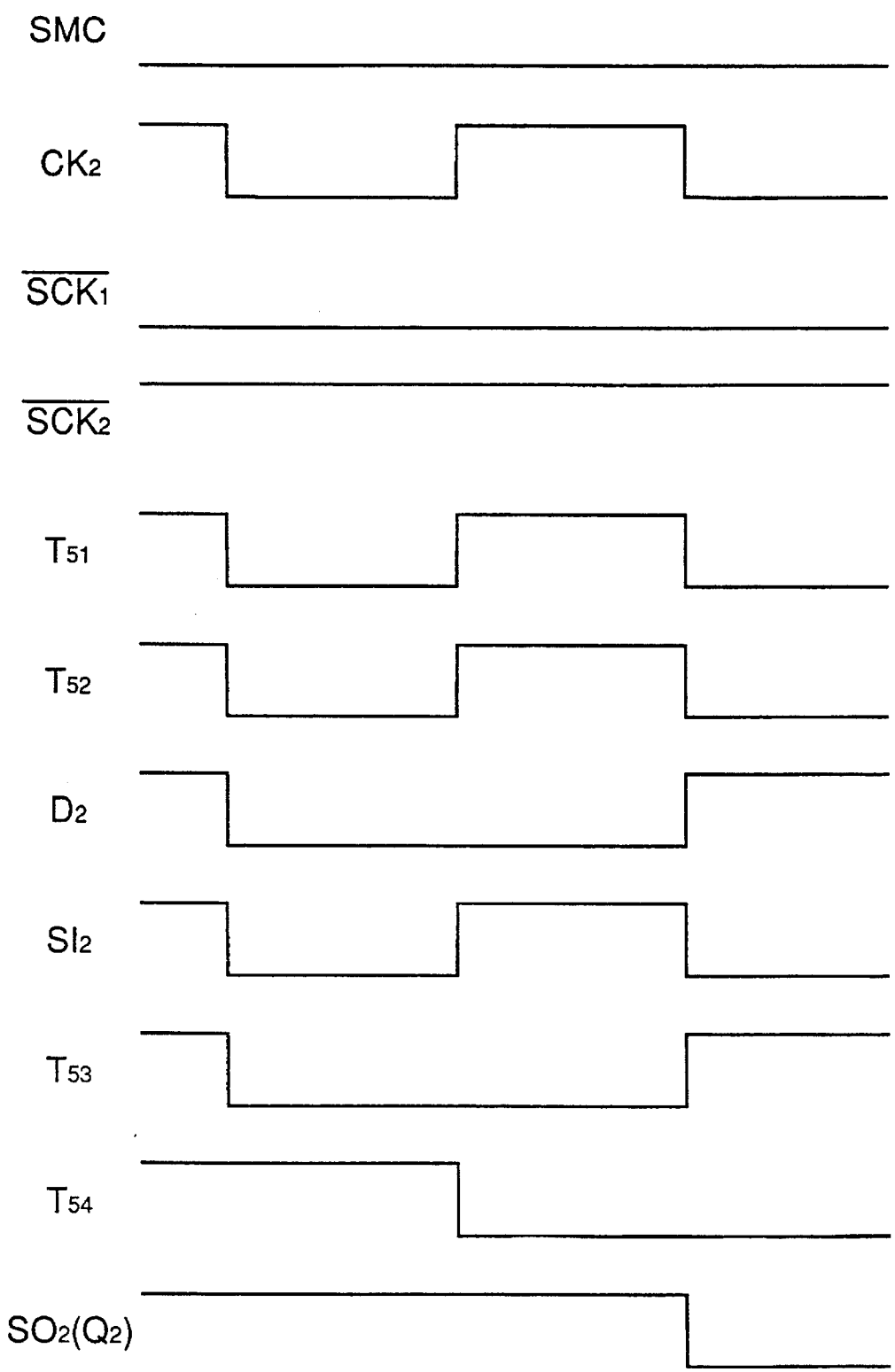
FIG. 8 is a timing chart illustrating an operation of the circuit shown in FIG. 5 at a non-testing time.

Also in this logic integrated circuit, if, at a non-testing time, the scan mode signal SMC, the inverted first test clock signal $SCK_1$ and the inverted second test clock signal $SCK_2$ are fixed to "0", "0" and "1", respectively, as shown in FIG. 8, the circuit operates as a flipflop having the data input signal D as its data input and the clock signal $CK_2$ as its clock input.

In the above mentioned two embodiments, the circuit operates as a flipflop at the non-testing time. However, if the circuit is constructed as shown in FIG. 9 which illustrates a third embodiment of the present invention, the circuit can operate as a latch at the non-testing time.

Figure 9:
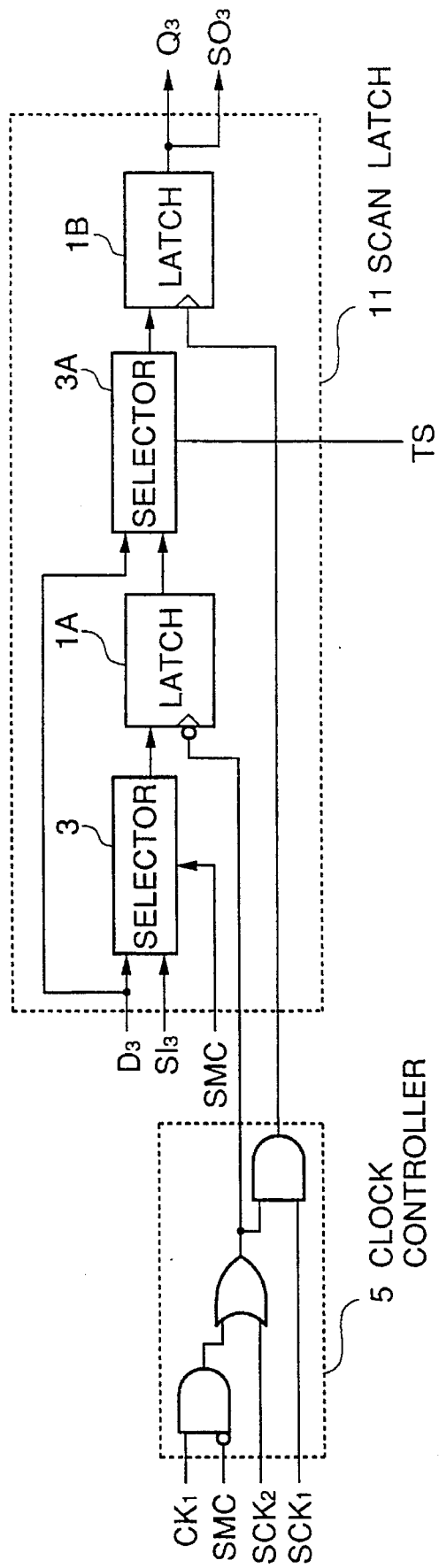
FIG. 9 is a detailed logic circuit diagram of the clock controller and the scan flipflop, showing a third embodiment of the scan path circuit in accordance with the present invention.

In FIG. 9, a scan latch 11 is constituted by inserting a second selector 3A between the latch circuit 1A and the latch circuit 1B in the scan flipflop 6. A test mode signal TS supplied to the second selector 3A is maintained at "1" in the test operation and at "0" in a non-testing operation. When the test mode signal TS is "1", the selector 3A selects the output of the latch 1A. and therefore, the scan latch 11 shown in FIG. 9 operates completely similarly to the scan flipflop 6.

When the test mode signal TS is "0", a data input signal $D_3$ is supplied from the selector 3A to the latch circuit 1B. The circuit shown in FIG. 9 operates as a latch having the data input signal $D_3$ as its data input. Similarly, a second selector can be inserted between the latch circuit 1B and the latch circuit 1A in the scan flipflop 10 shown in FIG. 5. In this case, at the non-testing time, the circuit operates as a latch driven by a negative going clock.

Incidentally, this scan latch circuit can be removed if no latching operation is required in the circuit. Even if the scan latch circuit is removed, the advantage of this embodiment can be similarly obtained.

Figure 10A:
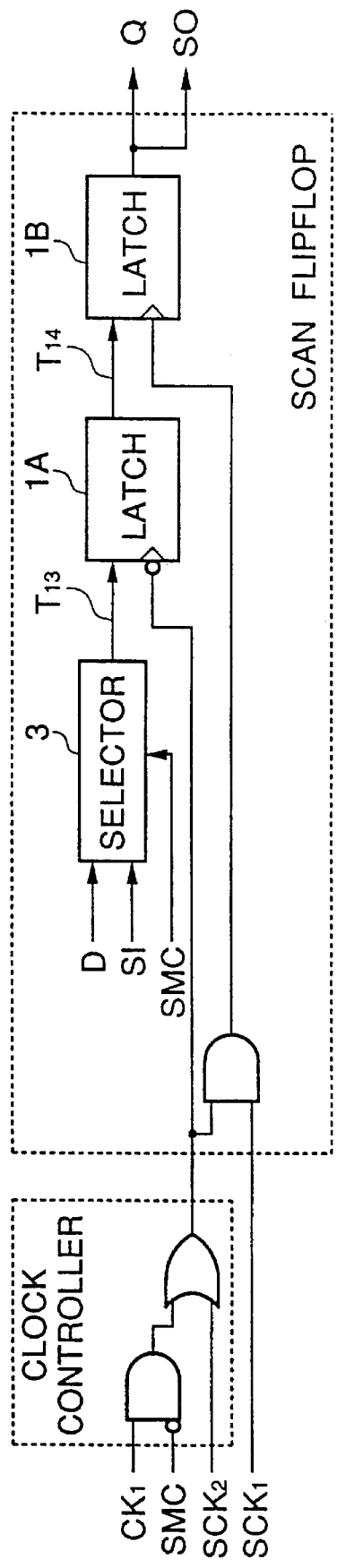
FIGS. 10A and 10B are detailed logic circuit diagrams of the clock controller and the scan flipflop, showing how the scan path circuit in accordance with the present invention can be divided.
Figure 10B:
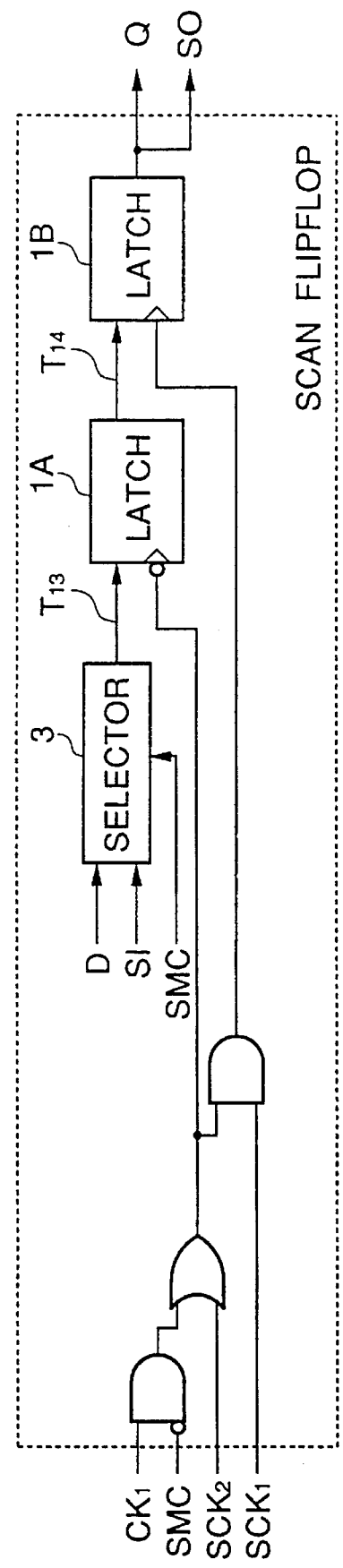

In the above description of the embodiments, the scan circuit is classified into the scan flipflop and the clock controller. However, this classification is only for convenience of explanation. Therefore, the circuit can be classified as shown in FIG. 10A, for example. Alternatively, the circuit can be handled as a single circuit as shown in FIG. 10B. Any difference in the classification does not change the advantages of the embodiments at all.

As mentioned above, the logic integrated circuit in accordance with the present invention is so configured that the first test clock signal and the second test clock signal are used and either of the normal clock signal and the first test clock signal is supplied through the scan controller to the scan flipflop. Therefore a multi-phase clock can be handled with no problem of the clock skew, and in addition, it is possible to test all the clock signals.

In comparison with a conventional flipflop, the scan flipflop can be realized by adding the selector corresponding to two gates. In addition, the clock controller corresponding to three gates can be used in common to a plurality of flipflops operating in the same phase. Accordingly, an overhead increased by the scan design is extremely low.

The invention has thus been shown and described with reference w the specific embodiments. However, it should be noted that the present invention is in no way limited to the details of the illustrated structures but changes and modifications may be made within the scope of the appended claims.

What is claimed is:

1. A logic circuit associated with a scan path circuit operable with a multi-phase clock, comprising:
   at least one clock controller including:
      a first control gate for receiving a clock signal and a scan mode signal and configured to maintain its output at a fixed value when said scan mode signal is active,
      a second control gate for receiving an output of said first control gate and a first test clock signal and for generating a first enable signal, and
      a third control gate for receiving an output of said second control gate and a second test clock signal and for generating a second enable signal; and
   at least one scan flipflop including:
      a selector having a pair of inputs for receiving a data input signal and a scan input signal, respectively, and a selection input for receiving said scan mode signal, wherein when said scan mode signal is active, said scan input signal is selected, and when said scan mode signal is inactive, said data input signal is selected,
      a first latch circuit having a data input for receiving an output of said selector and an enable terminal for receiving said first enable signal, and
      a second latch circuit having a data input for receiving an output of said first latch circuit and an enable terminal for receiving said second enable signal.

2. A logic circuit claimed in claim 1 wherein said first test clock signal, said second test clock signal and the scan mode signal are fixed to a predetermined value at a non-testing time.

3. A logic circuit claimed in claim 1 wherein a plurality of scan flipflops are provided, said first and second enable signals generated by said clock controller being supplied in common to said plurality of scan flipflops.

4. A logic circuit claimed in claim 1 wherein said first control gate, said second control gate and said third control gate each include a first AND gate, an OR gate and a second AND gate, respectively, said first AND gate for receiving an inverted signal of said scan mode signal, said enable terminal of said first latch circuit for receiving an inverted signal of said first enable signal, and said enable terminal of said second latch circuit for receiving said first enable signal in a non-inverted form.

5. A logic circuit claimed in claim 1 wherein said first control gate, said second control gate and said third control gate each include a first OR gate, an AND gate and a second OR gate, respectively, said first OR gate for receiving said scan mode signal in a non-inverted form, said enable terminal of said first latch circuit for receiving said first enable signal in a non-inverted form, and said enable terminal of said second latch circuit for receiving an inverted signal of said first enable signal.

6. A logic circuit claimed in claim 2 wherein said first control gate, said second control gate and said third control gate each include a first AND gate, an OR gate and a second AND gate, respectively, said first AND gate for receiving an inverted signal of said scan mode signal, said enable terminal of said first latch circuit for receiving an inverted signal of said first enable signal, and said enable terminal of said second latch circuit for receiving said first enable signal in a non-inverted form.

7. A logic circuit claimed in claim 2 wherein said first control gate, said second control gate and said third control gate each include a first OR gate, an AND gate and a second OR gate, respectively, said first OR gate for receiving said scan mode signal in a non-inverted form, said enable terminal of said first latch circuit for receiving said first enable signal in a non-inverted form, and said enable terminal of said second latch circuit for receiving an inverted signal of said first enable signal.

8. A logic circuit according to claim 1, wherein a plurality of scan flipflops are provided, said first and second enable signals generated by said clock controller being supplied in common to said plurality of scan flipflops.

9. A logic circuit according to claim 1, wherein when said clock signal input to said first control gate of said at least one clock controller is continually a predetermined value, a waveform applied to said at least one scan flip-flop from said at least one clock controller becomes different, such that clock error is identifiable based on an output of said at least one scan flipflop.

10. A logic circuit associated with a scan path circuit operable with a multi-phase clock, comprising:

at least one clock controller including:

a first control gate for receiving a clock signal and a scan mode signal and configured to maintain its output at a fixed value when said scan mode signal is active, a second control gate for receiving an output of said first control gate and a first test clock signal and for generating a first enable signal, and a third control gate for receiving an output of said second control gate and a second test clock signal and for generating a second enable signal; and at least one scan latch including:

a first selector having a pair of inputs for receiving a data input signal and a scan input signal, respectively, and a selection input for receiving said scan mode signal, wherein when said scan mode signal is active, said scan input signal is selected, and when said scan mode signal is inactive, said data input signal is selected, a first latch circuit having a data input for receiving an output of said first selector and an enable terminal for receiving said first enable signal, a second selector having a pair of inputs for receiving said data input signal and an output of said first latch circuit, respectively, and a selection input for receiving a test mode signal, wherein when said test mode signal is active, said output of said first latch circuit is selected, and when said test mode signal is inactive, said data input signal is selected, and a second latch circuit having a data input for receiving an output of said second selector and an enable terminal for receiving said second enable signal.

11. A logic circuit claimed in claim 10 wherein said first test clock signal, said second test clock signal and the scan mode signal are fixed to a predetermined value at a non-testing time.

12. A logic circuit claimed in claim 10 wherein said first control gate, said second control gate and said third control gate each include a first AND gate, an OR gate and a second AND gate, respectively, said first AND gate for receiving an inverted signal of said scan mode signal, said enable terminal of said first latch circuit for receiving an inverted signal of said first enable signal, and said enable terminal of said second latch circuit for receiving said first enable signal in a non-inverted form.

13. A logic circuit claimed in claim 10 wherein said first control gate, said second control gate and said third control gate each include a first OR gate, an AND gate and a second OR gate, respectively, said first OR gate for receiving said scan mode signal in a non-inverted form, said enable terminal of said first latch circuit for receiving said first enable signal in a non-inverted form, and said enable terminal of said second latch circuit for receiving an inverted signal of said first enable signal.

14. A logic circuit according to claim 10, wherein when said clock signal input to said first control gate of said at least one clock controller is continually a predetermined value, a waveform applied to said at least one scan flip-flop from said at least one clock controller becomes different, such that clock error is identifiable based on an output of said at least one scan flipflop.

15. A logic circuit claimed in claim 11 wherein said first control gate, said second control gate and said third control gate each include a first AND gate, an OR gate and a second AND gate, respectively, said first AND gate for receiving an inverted signal of said scan mode signal, said enable terminal of said first latch circuit for receiving an inverted signal of said first enable signal, and said enable terminal of said second latch circuit for receiving said first enable signal in a non-inverted form.

16. A logic circuit claimed in claim 11 wherein said first control gate, said second control gate and said third control gate each include a first OR gate, an AND gate and a second OR gate, respectively, said first OR gate for receiving said scan mode signal in a non-inverted form, said enable terminal of said first latch circuit for receiving said first enable signal in a non-inverted form, and said enable terminal of said second latch circuit for receiving an inverted signal of said first enable signal.

17. A logic circuit associated with a scan path circuit operable with a multi-phase clock, comprising:
   at least one clock controller including:
      a first control gate for receiving a clock signal and a scan mode signal and configured to maintain its output at a fixed value when said scan mode signal is active,
      a second control gate for receiving an output of said first control gate and a first test clock signal and for generating a first enable signal, and
      a third control gate for receiving an output of said second control gate and a second test clock signal and for generating a second enable signal;
   at least one scan latch including:
      a first selector having a pair of inputs for receiving a data input signal and a scan input signal, respectively, and
      a selection input for receiving said scan mode signal, wherein when said scan mode signal is active, said scan input signal is selected, and when said scan mode signal is inactive, said data input signal is selected,
      a first latch circuit having a data input for receiving an output of said first selector and an enable terminal for receiving said first enable signal,
      a second selector having a pair of inputs for receiving said data input signal and an output of said first latch circuit, respectively, and a selection input for receiving a test mode signal, wherein when said test mode signal is active, said output of said first latch circuit is selected, and when said test mode signal is inactive, said data input signal is selected, and
      a second latch circuit having a data input for receiving an output of said second selector and an enable terminal for receiving said second enable signal; and
   at least one scan flipflop including:
      a selector having a pair of inputs for receiving said data input signal and said scan input signal, respectively, and a selection input for receiving said scan mode signal, wherein when said scan mode signal is active, said scan input signal is selected, and when said scan mode signal is inactive, said data input signal is selected,
      a first latch circuit having a data input for receiving an output of said selector and an enable terminal for receiving said first enable signal, and
      a second latch circuit having a data input for receiving an output of said first latch circuit and an enable terminal receiving said second enable signal, said first and second enable signals generated by said clock controller being supplied in common to said at least one scan latch and said at least one scan flipflop.

18. A logic circuit claimed in claim 17 wherein a plurality of scan flipflops are provided, said first and second enable signals generated by said clock controller being supplied in common to said plurality of scan flipflops.

19. A logic circuit associated with a scan path circuit operable with a multi-phase clock, comprising:
   at least one clock controller including:
      a first control gate for receiving a clock signal and a scan mode signal and configured to maintain its output at a fixed value when said scan mode signal is active,
      a second control gate for receiving an output of said first control gate and a first test clock signal and for generating a first enable signal, and a third control gate for receiving an output of said second control gate and a second test clock signal and for generating a second enable signal; and
   at least one scan flipflop including:
      a selector having a pair of inputs for receiving a data input signal and a scan input signal, respectively, and a selection input for receiving said scan mode signal, wherein when said scan mode signal is active, said scan input signal is selected, and when said scan mode signal is inactive, said data input signal is selected,
      a first latch circuit having a data input for receiving an output of said selector and an enable terminal for receiving said first enable signal, and
      a second latch circuit having a data input for receiving an output of said first latch circuit and an enable terminal for receiving said second enable signal,
   wherein said first test clock signal, said second test clock signal and the scan mode signal are fixed to a predetermined value at a non-testing time,
   wherein a plurality of scan flipflops are provided, said first and second enable signals generated by said clock controller being supplied in common to said plurality of scan flipflops.

20. A logic circuit associated with a scan path circuit operable with a multi-phase clock, comprising:
   at least one clock controller including:
      a first control gate for receiving a clock signal and a scan mode signal and configured to maintain its output at a fixed value when said scan mode signal is active,
      a second control gate for receiving an output of said first control gate and a first test clock signal and for generating a first enable signal, and
      a third control gate for receiving an output of said second control gate and a second test clock signal and for generating a second enable signal;
   at least one scan latch including:
      a first selector having a pair of inputs for receiving a data input signal and a scan input signal, respectively, and
      a selection input for receiving said scan mode signal, wherein when said scan mode signal is active, said scan input signal is selected, and when said scan mode signal is inactive, said data input signal is selected,
      a first latch circuit having a data input for receiving an output of said first selector and an enable terminal for receiving said first enable signal,
      a second selector having a pair of inputs for receiving said data input signal and an output of said first latch circuit, respectively, and a selection input for receiving a test mode signal, wherein when said test mode signal is active, said output of said first latch circuit is selected, and when said test mode signal is inactive, said data input signal is selected, and
      a second latch circuit having a data input for receiving an output of said second selector and an enable terminal for receiving said second enable signal, wherein said first test clock signal, said second test clock signal and the scan mode signal are fixed to a predetermined value at a non-testing time; and
   at least one scan flipflop including:
      a selector having a pair of inputs for receiving said data input signal and said scan input signal, respectively, and a selection input for receiving said scan mode signal, wherein when said scan mode signal is active, said scan input signal is selected, and when said scan mode signal is inactive, said data input signal is selected, a first latch circuit having a data input for receiving an output of said selector and an enable terminal for receiving said first enable signal, and a second latch circuit having a data input for receiving an output of said first latch circuit and an enable terminal receiving said second enable signal, said first and second enable signals generated by said clock controller being supplied in common to said at least one scan latch and said at least one scan flipflop.

* * * * *